United States Patent
Zhou

(10) Patent No.: US 7,325,294 B2
(45) Date of Patent: Feb. 5, 2008

(54) METHOD OF MAKING ELECTROMAGNETIC WAVE SHIELDED WRITE AND READ WIRES ON A SUPPORT FOR A MAGNETIC MEDIA DRIVE

(75) Inventor: Lin Zhou, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 516 days.

(21) Appl. No.: 10/991,900

(22) Filed: Nov. 17, 2004

(65) Prior Publication Data

US 2005/0088783 A1  Apr. 28, 2005

Related U.S. Application Data

(62) Division of application No. 10/133,596, filed on Apr. 26, 2002, now Pat. No. 6,839,202.

(51) Int. Cl.
G11B 5/187 (2006.01)
(52) U.S. Cl. .............. 29/603.03; 29/603.04; 29/846; 29/868; 205/128; 205/135; 204/192.34; 204/192.17; 174/350
(58) Field of Classification Search .......... 29/603.03, 29/603.04, 603.07, 846, 868, 33 F; 205/125, 205/128, 135; 204/192.34, 192.17; 174/350; 360/234.5, 245.8, 245.9, 264.2
See application file for complete search history.

(56) References Cited

U.S. PATENT DOCUMENTS

| | | | | |
|---|---|---|---|---|
| 2,728,693 A | * | 12/1955 | Cado ................ | 205/135 X |
| 4,290,844 A | * | 9/1981 | Rotolante et al. ... | 204/192.34 X |
| 4,564,723 A | | 1/1986 | Lang ................ | 174/36 |
| 4,636,900 A | | 1/1987 | Tung et al. ........ | 360/124 X |
| 4,819,094 A | | 4/1989 | Oberg .............. | 360/245.9 |
| 4,926,007 A | | 5/1990 | Aufderheide et al. ... | 174/36 |
| 4,962,437 A | | 10/1990 | Wilcox ............ | 360/103 |

(Continued)

FOREIGN PATENT DOCUMENTS

JP   9-282625   * 10/1997

OTHER PUBLICATIONS

Ansley, A., "A Small Three-Dimensional Printed Wiring Module", IRE Trasactions on Production Techniques, vol. 3, Issue 1, Apr. 1958, pp. 26-30, 38.*

Primary Examiner—A. Dexter Tugbang
(74) Attorney, Agent, or Firm—Ervin F. Johnston; Jeffrey P. Aiello

(57) ABSTRACT

A method of making electromagnetic wave shielded read and write wires is provided. The method includes forming a bottom insulation layer on a bottom shield layer formed on a substrate. Then, forming electrically conductive wire material into openings in a first forming layer to form first and second read wires and first and second write wires. Forming a top insulation layer on the bottom insulation layer and on the wires. Then, forming a second forming layer on the top insulation layer with first, second, third, fourth and fifth openings down to the top insulation layer. Ion milling portions of the top insulation layer exposed by the openings in the second forming layer down to the bottom shield layer, then removing the second forming layer. Then, forming nonmagnetic electrically conductive middle shield layers in the openings in electrical contact with the bottom shield layer and forming a top shield layer on top of the middle shield layer.

13 Claims, 10 Drawing Sheets

U.S. PATENT DOCUMENTS

| | | | |
|---|---|---|---|
| 5,491,597 A | 2/1996 | Bennin et al. | 360/245.9 |
| 5,608,591 A | 3/1997 | Klaassen | 360/245.9 |
| 5,694,272 A | 12/1997 | Bang | 360/264.2 |
| 5,737,152 A | 4/1998 | Balakrishnan | 360/245.9 |
| 5,754,369 A | 5/1998 | Balakrishman | 360/104 |
| 5,871,655 A | 2/1999 | Lee et al. | 216/22 |
| 5,896,249 A | 4/1999 | Fontana et al. | 360/234.5 |
| 5,946,163 A | 8/1999 | Boutaghou et al. | 360/264.2 |
| 5,959,808 A | 9/1999 | Fan et al. | 360/106 |
| 5,995,328 A | 11/1999 | Balakrishnan | 360/245.9 |
| 6,028,748 A | 2/2000 | Kuroe et al. | 360/110 |
| 6,088,235 A | 7/2000 | Chiao et al. | 361/777 |
| 6,487,047 B1 | 11/2002 | Balakrishnan | 360/245.8 |
| 6,487,048 B1 | 11/2002 | Dunn | 360/245.9 |

* cited by examiner

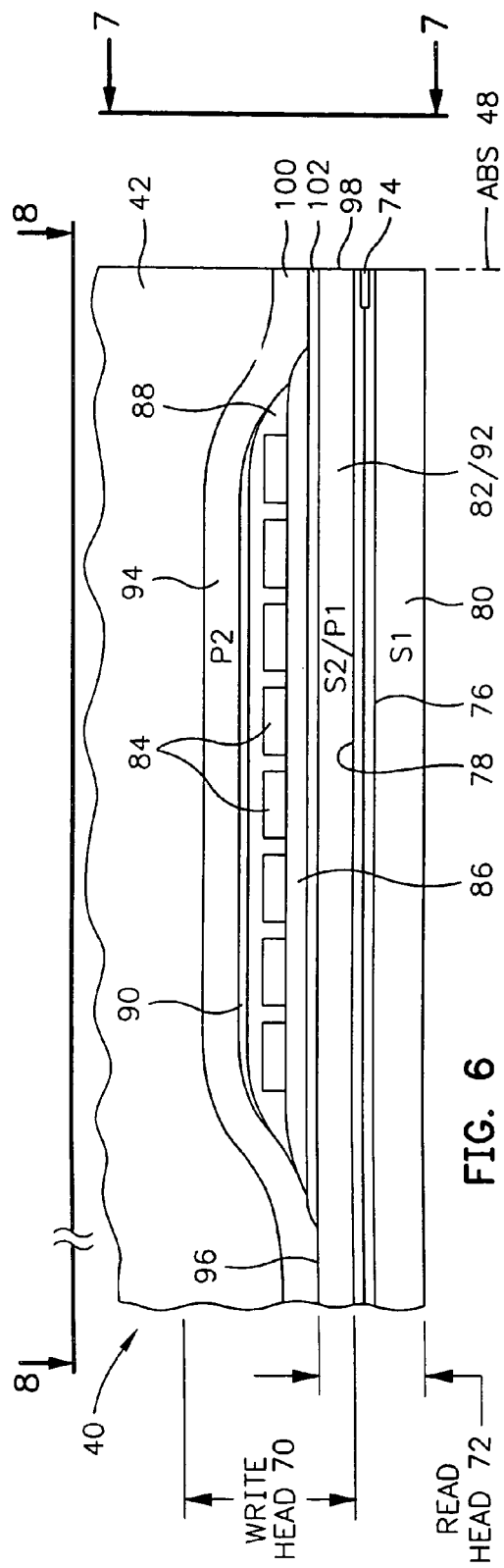

(ABS)

METHOD OF MAKING ELECTROMAGNETIC WAVE SHIELDED WRITE AND READ WIRES ON A SUPPORT FOR A MAGNETIC MEDIA DRIVE

REFERENCE TO RELATED APPLICATION

This is a divisional application of Application No. 10/133,596, filed Apr. 26, 2002, now U.S. Pat. No.: 6,839,202, issued Jan. 4, 2005.

BACKGROUND OF THE INVENTION

1. Field of the Invention

The present invention relates to write and read wires on a support, such as a suspension for a magnetic disk drive, having grounded electromagnetic wave shields for reducing cross talk between the write and read wires and for reducing ambient noise pickup and, more particularly, to each of a pair of read wires wrapped in a grounded conductive sheath for reducing the cross talk and the ambient noise pickup and preferably also each of a pair of write wires wrapped in a grounded conductive sheath for still further reducing the cross talk between the write and read wires.

2. Description of the Related Art

The heart of a computer is a magnetic disk drive which includes a magnetic disk, a slider that has read and write heads, a suspension arm and an actuator arm that swings the suspension arm to place the read and write heads over or under selected circular tracks on the disk when the disk is rotating. The suspension arm urges the slider into contact with the surface of the disk or parks the slider on a ramp when the disk is not rotating but, when the disk rotates and the slider is positioned to face the rotating disk, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic field signals to and reading magnetic field signals from the rotating disk. The read and write heads are connected to processing circuitry that operates according to a computer program to implement the writing and reading functions.

In the magnetic disk drive first and second write wires and first and second read wires typically extend along a major surface of the suspension. The write wires extend from first and second write pads on a slider, which is carried by the suspension, and extend to processing circuitry remote from the suspension. In a like manner, first and second read wires extend from first and second read pads on the slider to the processing circuitry. The read and write wires are typically in close proximity to each other as they extend from the slider to the processing circuitry.

The write wires carry a write current which is applied by the processing circuitry to a write coil in the write head. The write current, which alternates between positive and negative, causes the write coil to induce magnetic fields into first and second pole pieces of the write head. Magnetic moments in the pole pieces are rotated by the alternating fields from the write coil to write the magnetic impressions into the rotating magnetic disk. The processing circuitry also transmits a sense current through the first and second read wires to a very small read sensor in the read head. When the read sensor picks up field signals from the rotating magnetic disk the resistance of the sensor changes which causes corresponding potential changes in the processing circuitry. These potential changes are detected as playback signals. Because of the proximity of the write and read wires an alternating flux about the write wires, due to alternating current in the write wires, is imposed on the read wires which causes an unwanted current therein. This unwanted current, which is referred to as cross talk which may degrade the read head.

A still further problem is the ambient noise picked up by the read wires from electromagnetic waves in the outside environment. These electromagnetic waves may be caused by the operation of various components of the disk drive, such as the actuator and a motor for rotating one or more magnetic disks. These electromagnetic waves reduce the signal-to-noise ratio (SNR) and increase the bit error rate (BER) in the read circuit.

It should be noted that the higher the frequency of the write circuit or ambient electromagnetic waves the higher the noise spikes within the read circuit. Noise spikes may be very damaging to the sensor in the read head. This is because the sensor is very thin and cannot carry much current without being destroyed.

SUMMARY OF THE INVENTION

In one aspect of the invention each of the first and second read wires is wrapped in a conductive sheath which may be grounded to the suspension. The conductive sheaths of the read wires extend between the first and second read pads on the slider and the processing circuitry. With this arrangement outside electromagnetic waves from either the write wires or from the ambient environment are prevented from intrusion on the read wires or are at least attenuated. The conductive sheath around each read wire picks up the electromagnetic wave intrusions which causes the current to be generated in the conductive sheath instead of being generated in the read wire. In a preferred embodiment each of the first and second write wires is also wrapped in a conductive sheath. This still further eliminates electromagnetic wave intrusions on the read wires in combination with the conductive sheaths about the read wires or still further attenuates such intrusions. The material and thicknesses of the conductive sheaths and the frequency of the electromagnetic wave intrusions determine the degree to which the intrusions are eliminated on the read wires. These parameters are discussed in detail hereinafter.

An object of the invention is to eliminate or at least attenuate electromagnetic wave intrusions on read wires of a read circuit in a magnetic disk drive.

Another object is to provide a method for accomplishing the foregoing object.

Other objects and attendant advantages of the invention will be appreciated upon reading the following description taken together with the accompanying drawings.

BRIEF DESCRIPTION OF THE DRAWINGS

FIG. 6 is a partial view of the slider and the present write head as seen in plane 6-6 of FIG. 2;

FIG. 7 is a partial ABS view of the slider taken along plane 7-7 of FIG. 6 to show the read and write elements of the magnetic head;

FIG. 8 is a view taken along plane 8-8 of FIG. 6 with all material above the coil layer and leads removed;

DESCRIPTION OF THE PREFERRED EMBODIMENTS

Magnetic Disk Drive

Figure 1:
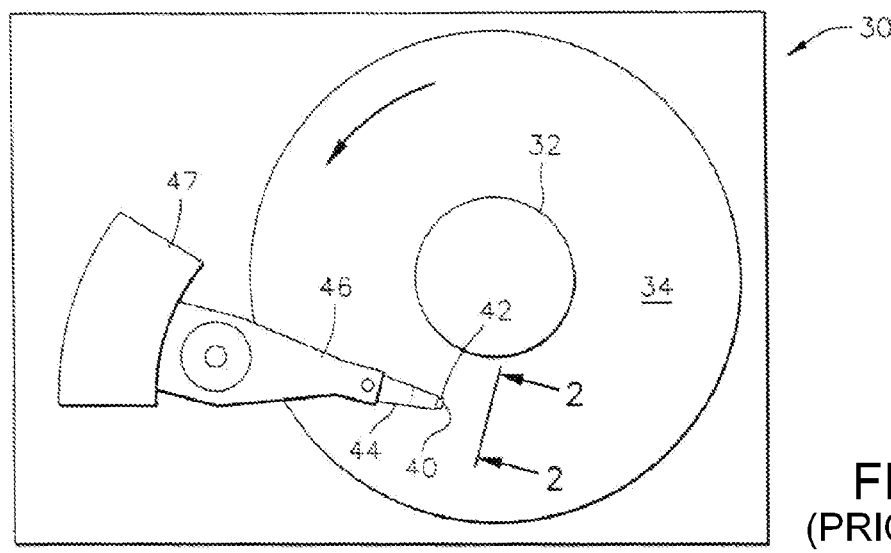
FIG. 1 is a plan view of an exemplary prior art magnetic disk drive.
Figure 2:
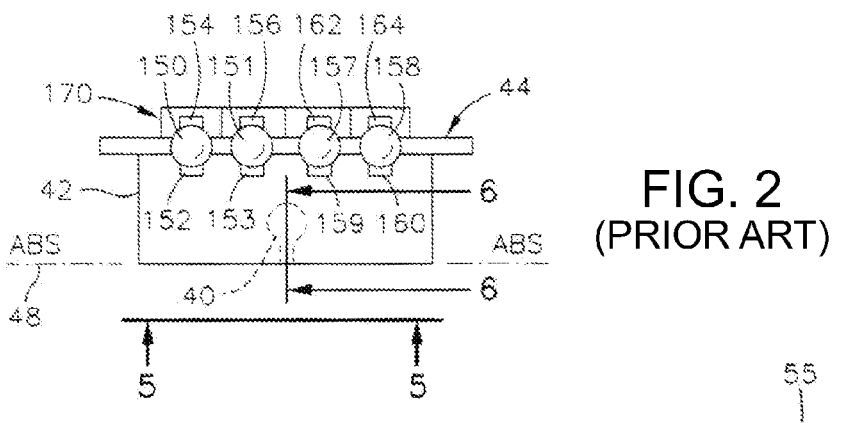
FIG. 2 is an end view of a prior art slider with a magnetic head of the disk drive as seen in plane 2-2 of FIG. 1.
Figure 3:
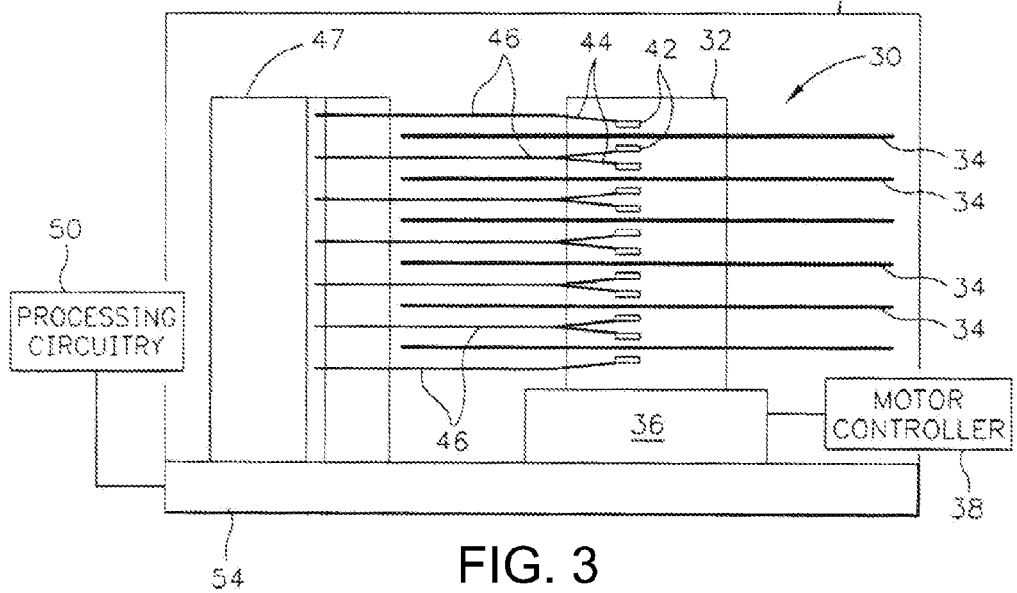
FIG. 3 is an elevation view of the prior art magnetic disk drive wherein multiple disks and magnetic heads are employed.
Figure 4:
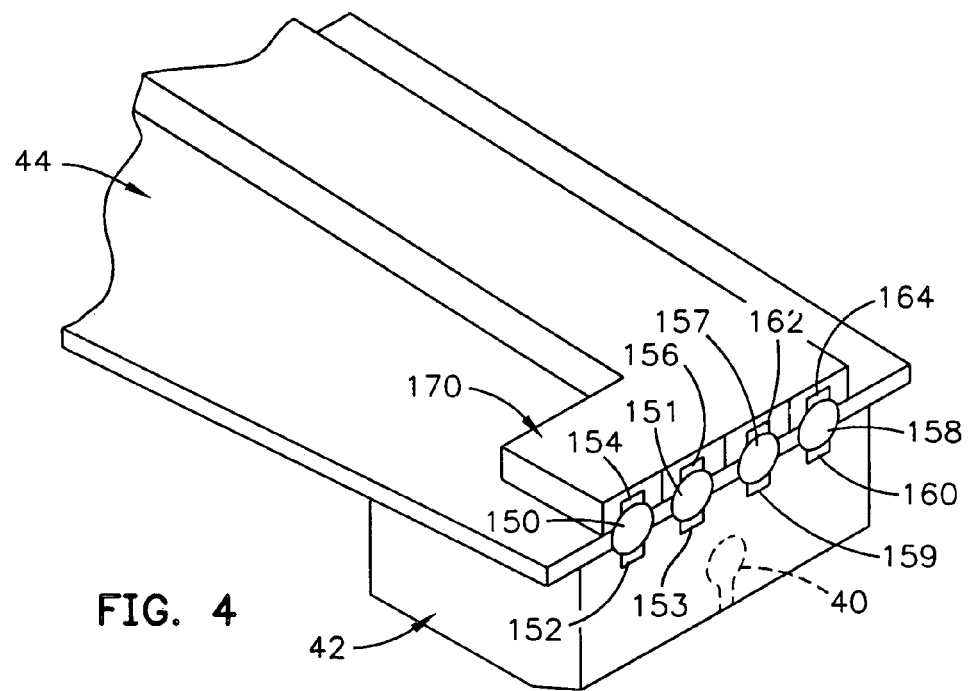
FIG. 4 is an isometric illustration of an exemplary suspension system for supporting the slider, magnetic head and a cable of the present invention.

Referring now to the drawings wherein like reference numerals designate like or similar parts throughout the several views, FIGS. 1-3 illustrate a magnetic disk drive 30. The drive 30 includes a spindle 32 that supports and rotates a magnetic disk 34. The spindle 32 is rotated by a spindle motor 36 that is controlled by a motor controller 38. A slider 42 has a combined read and write magnetic head 40 and is supported by a suspension 44 and actuator arm 46 that is rotatably positioned by an actuator 47. A plurality of disks, sliders and suspensions may be employed in a large capacity direct access storage device (DASD) as shown in FIG. 3. The suspension 44 and actuator arm 46 are moved by the actuator 47 to position the slider 42 so that the magnetic head 40 is in a transducing relationship with a surface of the magnetic disk 34. When the disk 34 is rotated by the spindle motor 36 the slider is supported on a thin cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides spindle motor drive signals for rotating the magnetic disk 34, and provides control signals to the actuator for moving the slider to various tracks. In FIG. 4 the slider 42 is shown mounted to a suspension 44. The components described hereinabove may be mounted on a frame 54 of a housing 55, as shown in FIG. 3.

Figure 5:
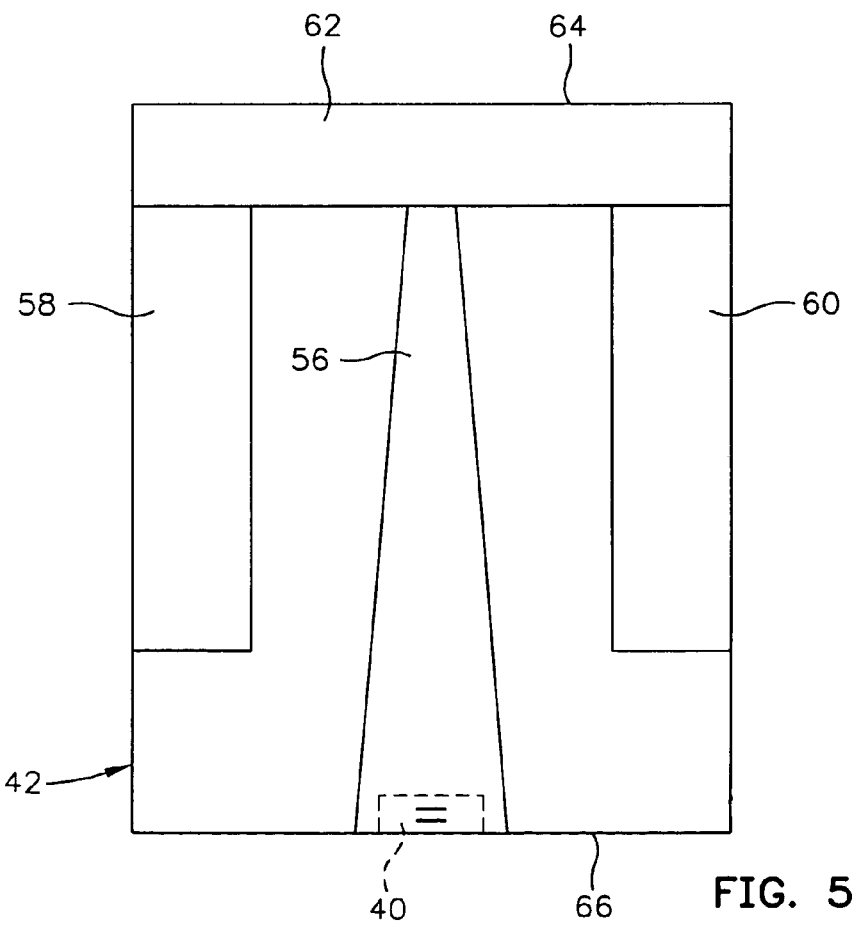
FIG. 5 is an ABS view of the magnetic head taken along plane 5-5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

FIG. 6 is a side cross-sectional elevation view of a merged magnetic head assembly 40, which includes a write head portion 70 and a read head portion 72, the read head portion employing a read sensor 74. FIG. 7 is an ABS view of FIG. 6. The sensor 74 is sandwiched between nonmagnetic electrically nonconductive first and second read gap layers 76 and 78, and the read gap layers are sandwiched between ferromagnetic first and second shield layers 80 and 82. In response to external magnetic fields, the resistance of the sensor 74 changes. A sense current conducted through the sensor causes these resistance changes to be manifested as potential changes. These potential changes are then processed as readback signals by the processing circuitry 50 shown in FIG. 3.

The write head portion 70 of the magnetic head 40 includes a coil layer 84 sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. Since the second shield layer 82 and the first pole piece layer 92 are a common layer this head is known as a merged head. In a piggyback head the second shield layer and the first pole piece layer are separate layers which are separated by a nonmagnetic layer.

Figure 9:
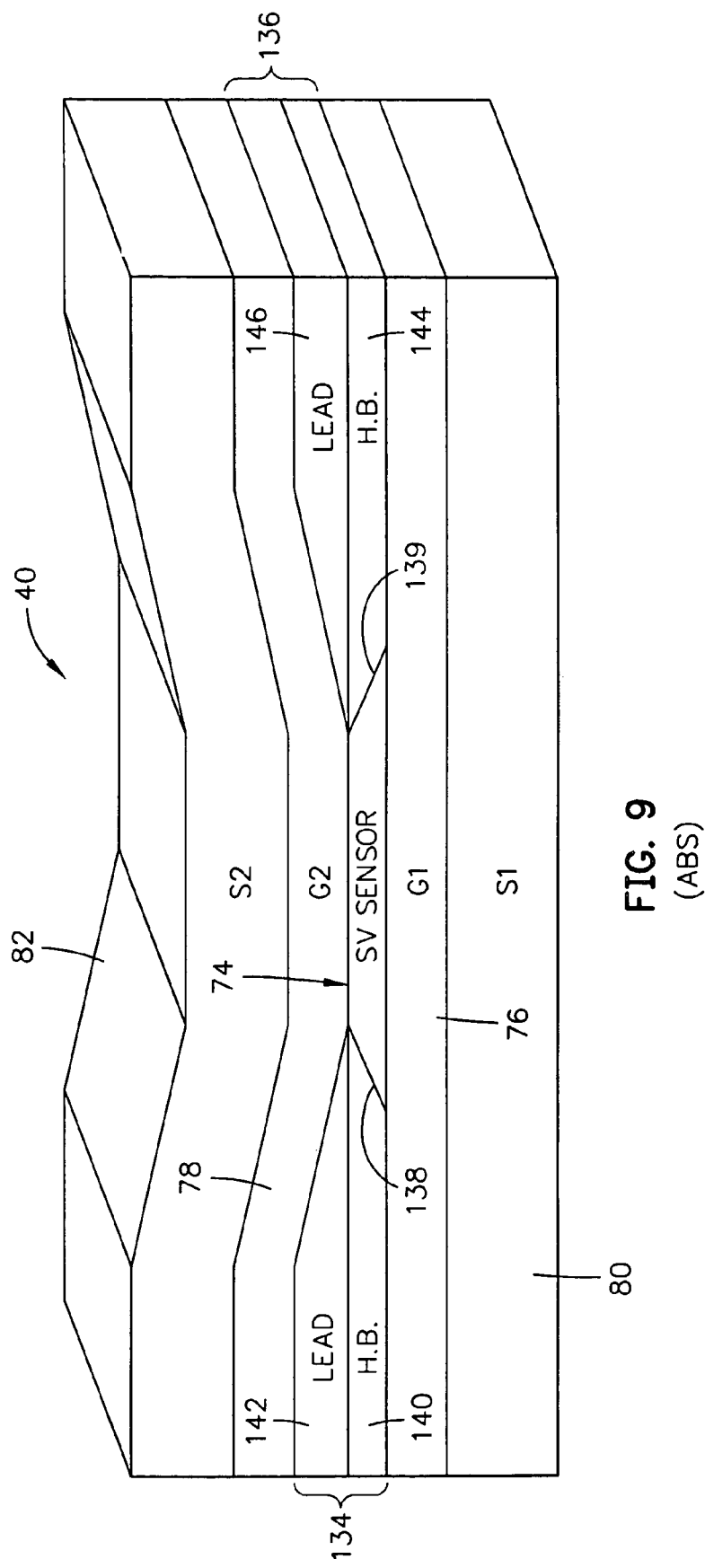
FIG. 9 is an enlarged isometric ABS illustration of the read head.

FIG. 9 is an isometric ABS illustration of the read head 40 shown in FIG. 6. First and second hard bias and lead layers 134 and 136 are connected to first and second side surfaces 138 and 139 of the spin valve sensor. This connection is known in the art as a contiguous junction and is fully described in commonly assigned U.S. Pat. No. 5,018,037 which is incorporated by reference herein. The first hard bias and lead layers 134 include a first hard bias layer 140 and a first lead layer 142 and the second hard bias and lead layers 136 include a second hard bias layer 144 and a second lead layer 146. The hard bias layers 140 and 144 cause magnetic fields to extend longitudinally through the spin valve sensor 74 for stabilizing the magnetic domains therein. The spin valve sensor 74 and the first and second hard bias and lead layers 134 and 136 are located between the first and second read gap layers 76 and 78. The first and second read gap layers 76 and 78 are, in turn, located between the ferromagnetic first and second shield layers 80 and 82.

As shown in FIGS. 2 and 4, first and second solder balls 150 and 151 connect read pads 152 and 153 on the slider 42 to read wires 154 and 156 on the suspension 44, and third and fourth solder balls 157 and 158 connect write pads 159 and 160 on the slider to write wires 162 and 164 on the suspension. The read pads 152 and 153 are connected to the read leads 142 and 146 in FIG. 9 and the write pads 159 and 160 are connected to the write leads 120 and 122 shown in FIG. 8. The read and write wires 154, 156, 162 and 164 are integrated in a cable 170 of the present invention which is described hereinbelow.

The Invention

The cable 170 extends along and on top of the suspension 44, as shown in FIG. 4. The cable 170, which includes the first and second read wires 154 and 156 and the first and second write wires 162 and 164, extends between a front edge 171 of the suspension and the processing circuitry 50 shown in FIG. 3. Accordingly, the wires 154, 156, 162 and 164 extend within the cable 170 from the solder balls 150, 151, 157 and 158 to a recessed end (not shown) of the cabling where they are connected to the processing circuitry 50. The cable 170, which is shown in cross-section in FIG. 10, is for the purpose of eliminating or at least attenuating cross talk and the pick up of electromagnetic waves by the first and second read wires 150 and 152.

Figure 10:
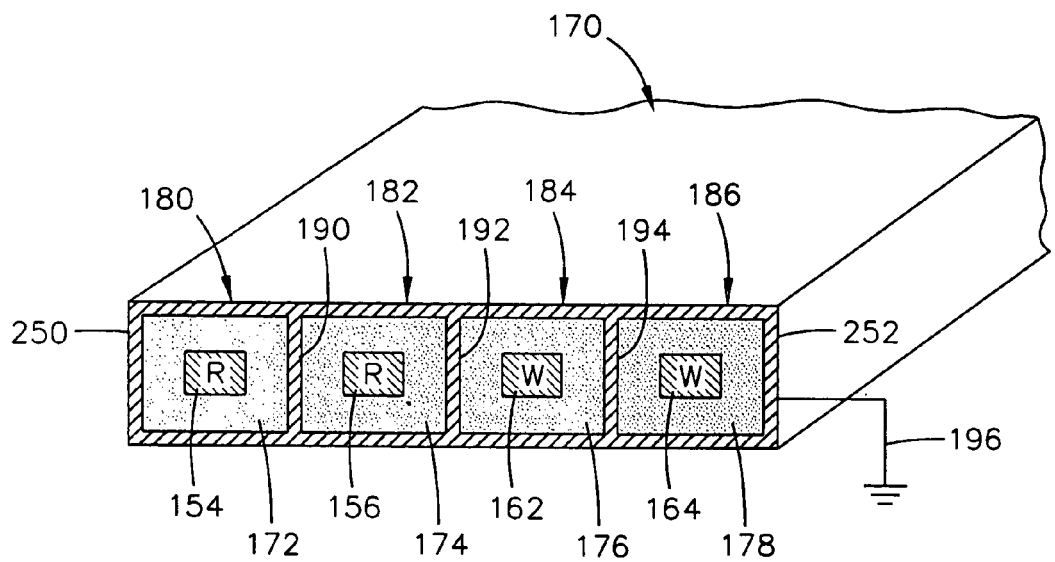
FIG. 10 is an isometric cross-section of the read and write wires of the present invention.

As shown in FIG. 10, the first and second read wires 154 and 156 are wrapped in nonmagnetic electrically nonconductive first and second insulative sheaths 172 and 174 and the first and second write wires 162 and 164 are wrapped in nonmagnetic electrically nonconductive third and fourth insulative sheaths 176 and 178. The first, second, third and fourth insulative sheaths 172, 174, 176 and 178 are, in turn, wrapped in nonmagnetic electrically conductive first, second, third and fourth conductive sheaths 180, 182, 184 and 186. The conductive sheaths 180, 182, 184 and 186 are made of a nonmagnetic conductive material such as silver (Ag), copper (Cu), gold (Au), aluminum (Al), titanium (Ti), tantalum (Ta) or tungsten (W). Further, in a preferred embodiment, the first and second conductive sheaths 180 and 182 have a common wall or side 190, the second and third conductive sheaths 182 and 184 have a common wall or side 192 and the third and fourth conductive sheaths 184 and 186 have a common wall or side 194. Still further, in a preferred embodiment the insulative sheaths 172, 174, 176 and 178 are composed of bottom and top layers, which will be described in more detail hereinafter, and the conductive sheaths 180, 182, 184 and 186 are composed of bottom, middle and top layers, which will be discussed in more detail hereinafter.

A preferred material for the insulator sheaths 172, 174, 176 and 178 is aluminum oxide ($Al_2O_3$). A unique method of construction, to be described hereinafter, configures the wires, the insulator sheaths and the conductive sheaths with a rectangular or square fashion, as shown in FIG. 10. The conductive sheaths 180, 182, 184 and 186 are grounded which is schematically shown at 196. From a practical standpoint the grounding can be to the suspension 44 shown in FIG. 4. It should be noted that the conductive sheaths 180, 182, 184 and 186 will absorb fluctuating electromagnetic wave intrusions emanating from the write wires 162 and 164 so that these waves will not be imposed upon the first and second read wires 154 and 156. Further, the conductive sheaths 180 and 182 will absorb any outside electromagnetic waves so that they are not absorbed by the first and second read wires 154 and 156. Accordingly, background noise is eliminated or at least attenuated in the read wires 154 and 156 by the conductive shields 180 and 182. Any current generated within the shields 180, 182, 184 and 186 due to fluctuating fields and electromagnetic energy absorbed thereby is shorted to ground at 196.

Method of the Invention

Figure 11A:
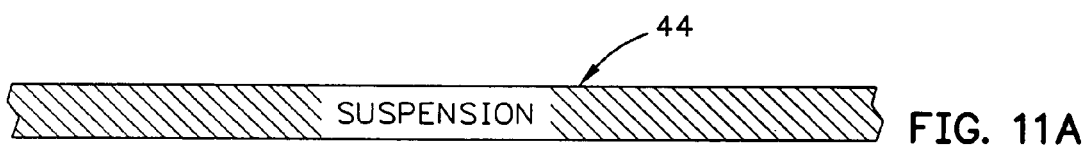
FIGS. 11A-11P show a preferred sequence of steps in a method of making the present invention.
Figure 11B:
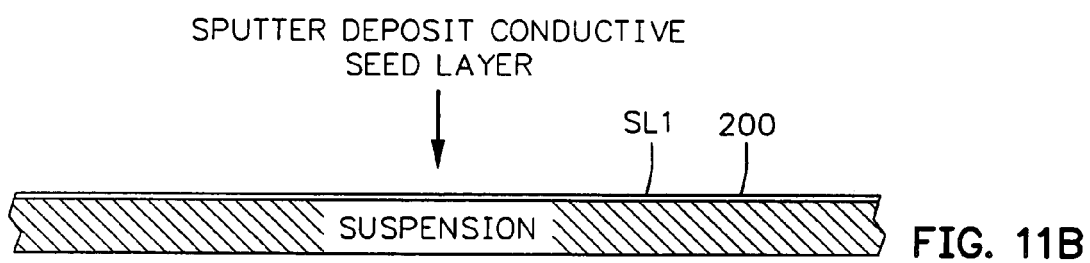
Figure 11C:
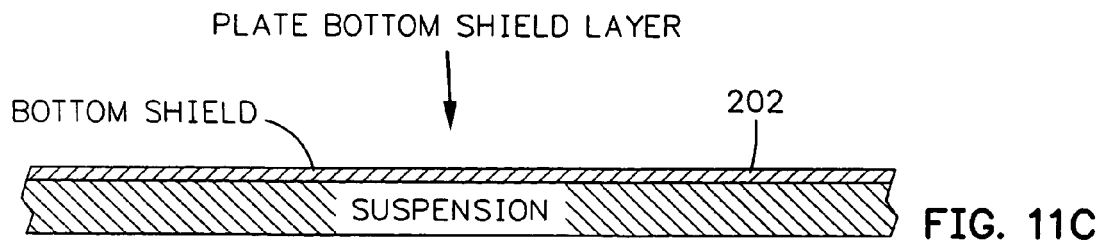
Figure 11D:
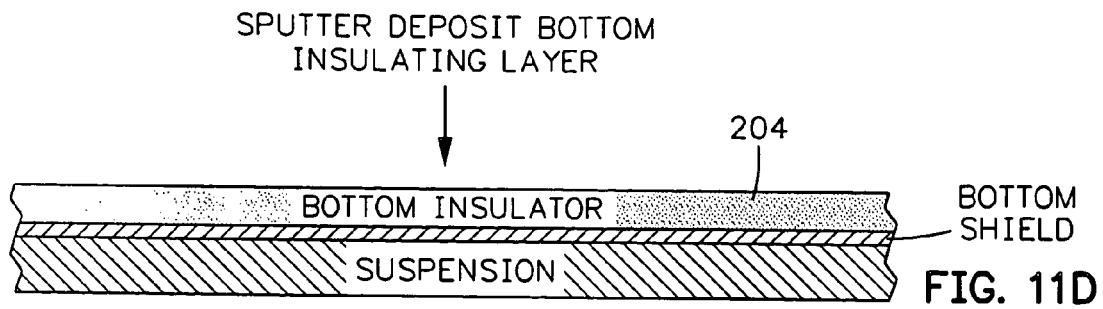

A preferred sequence of steps in a method of making the present invention, 15 illustrated in FIG. 10, is shown in FIGS. 11A-11P using copper (Cu) as an example. The invention is preferably integrated into an existing suspension fabrication process. A first step is to provide a substrate, which is preferably a suspension baseplate 44, as shown in FIG. 11A. FIG. 11B is the same as FIG. 11A except an electrically conductive first seed layer (SL1), which is preferably copper (Cu), is sputter 20 deposited on the suspension 44. FIG. 11C is the same as FIG. 11B except a nonmagnetic electrically conductive bottom shield layer 202, which is preferably copper (Cu), is plated on the first seed layer. FIG. 11D is the same as FIG. 11C except an electrically nonconductive bottom insulator layer 204, which is preferably aluminum oxide ($Al_2O_3$), is sputter deposited on the bottom shield layer.

Figure 11E:
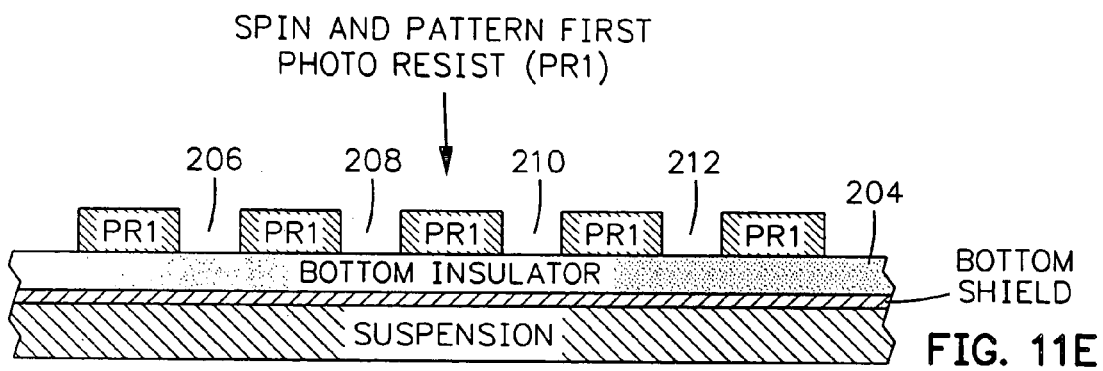
Figure 11F:
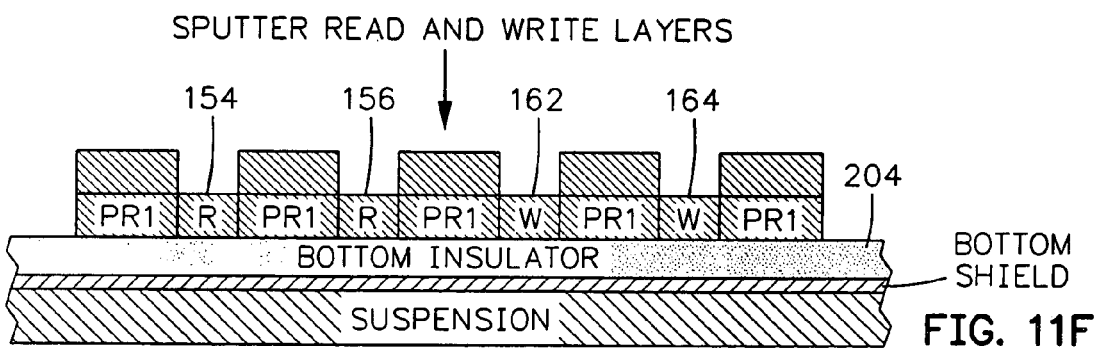
Figure 11G:
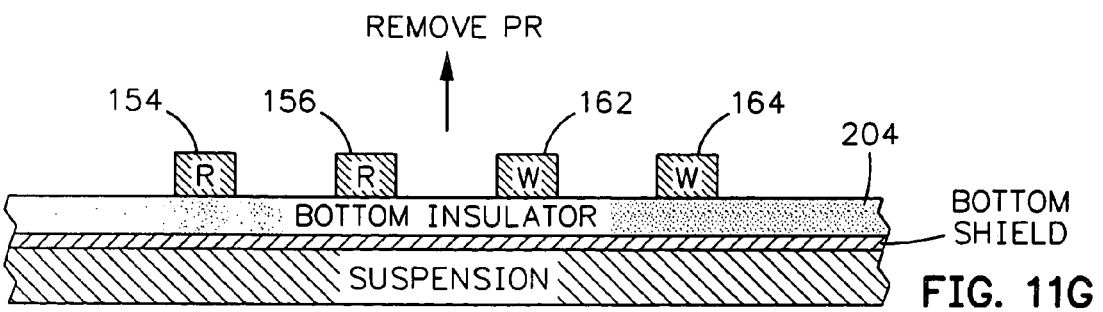
Figure 11H:
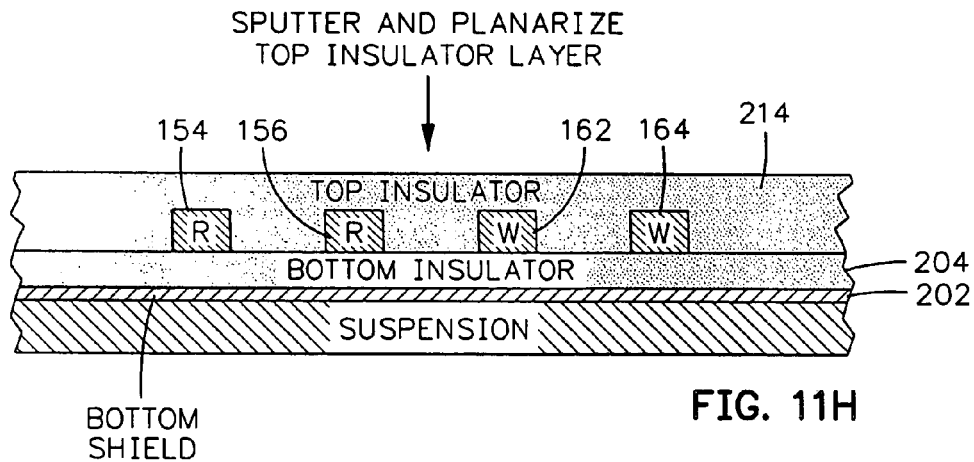

FIG. 11E is the same as FIG. 11D except a first photoresist layer (PR1) is spin coated on the bottom insulator layer and patterned with first, second, third and fourth openings 206, 208, 210 and 212 down to the bottom insulator layer 204. FIG. 11F is the same as FIG. 11E except electrically conductive wire material is sputter deposited into the four openings 206, 208, 210 and 212 to form said first and second read wires 154 and 156 and the first and second write wires 162 and 164. FIG. 11G is the same as FIG. 11F except the remaining first photoresist layer (PR1) has been removed. FIG. 11H is the same as FIG. 11G except an electrically nonconductive top insulator layer 214, which is preferably aluminum oxide ($Al_2O_3$), has been sputter deposited on the bottom insulator layer 204 and about and on top of each of the first and second read wires 154 and 156 and the first and second write wires 162 and 164.

Figure 11I:
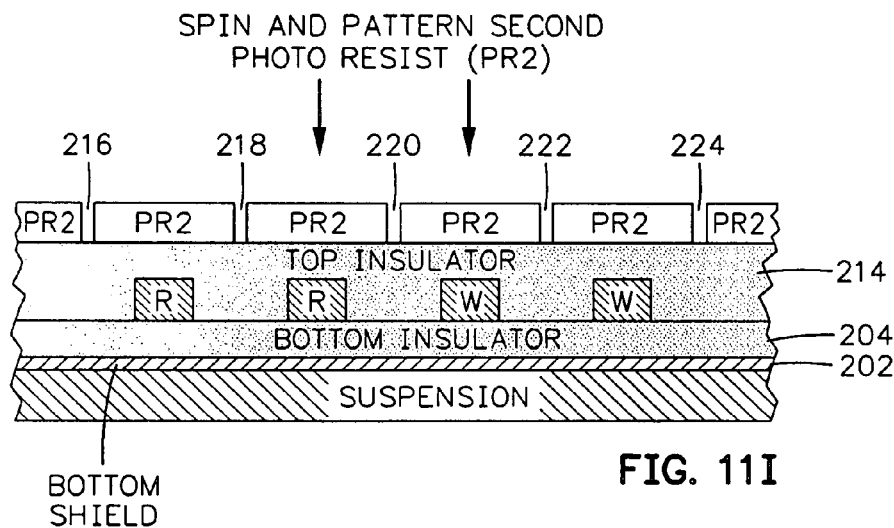
Figure 11J:
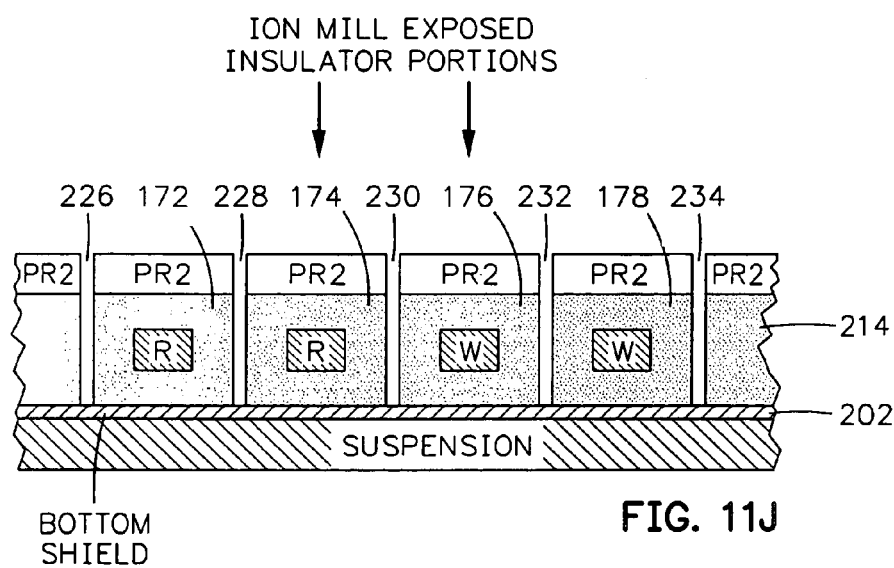

FIG. 11I is the same as FIG. 11H except a second photoresist layer (PR2) has been formed form as a second forming layer on the top insulator layer 214 and patterned with first, second, third, fourth and fifth openings 216, 218, 220, 222 and 224 down to the top of the top insulator layer 214. FIG. 11J is the same as FIG. 11I except exposed portions of the top insulator layer 214 and the bottom insulator layer 204 have been ion milled down to the top surface of the bottom shield layer 202 to provide first, second, third, fourth and fifth openings 226, 228, 230, 232 and 234 which are deeper than the first, second, third, fourth and fifth openings 216, 218, 220, 222 and 224 in FIG. 11I. At this stage of the process the first and second read wires 154 and 156 are provided with the first and second insulative sheaths 172 and 174 and the first and second write wires 162 and 164 have been provided with the third and fourth insulative sheaths 176 and 178 shown in FIG. 10.

Figure 11K:
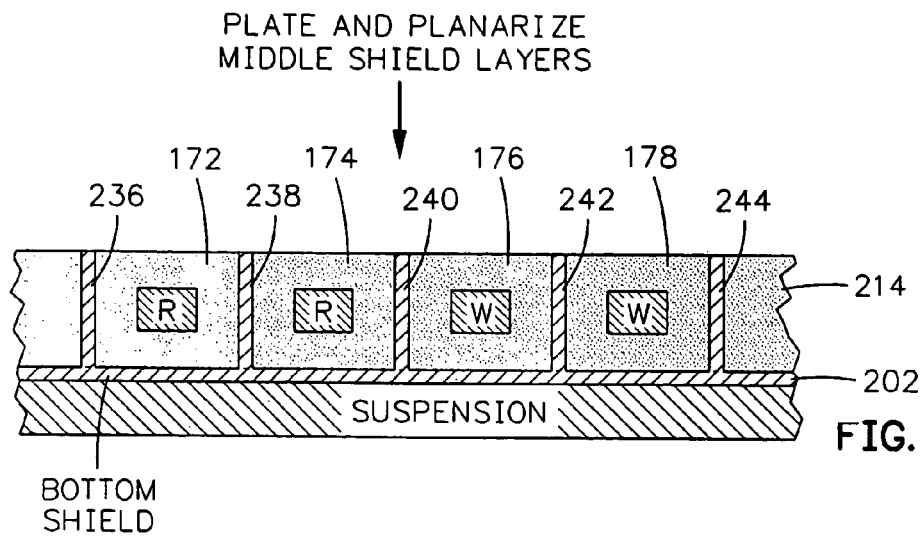
Figure 11L:
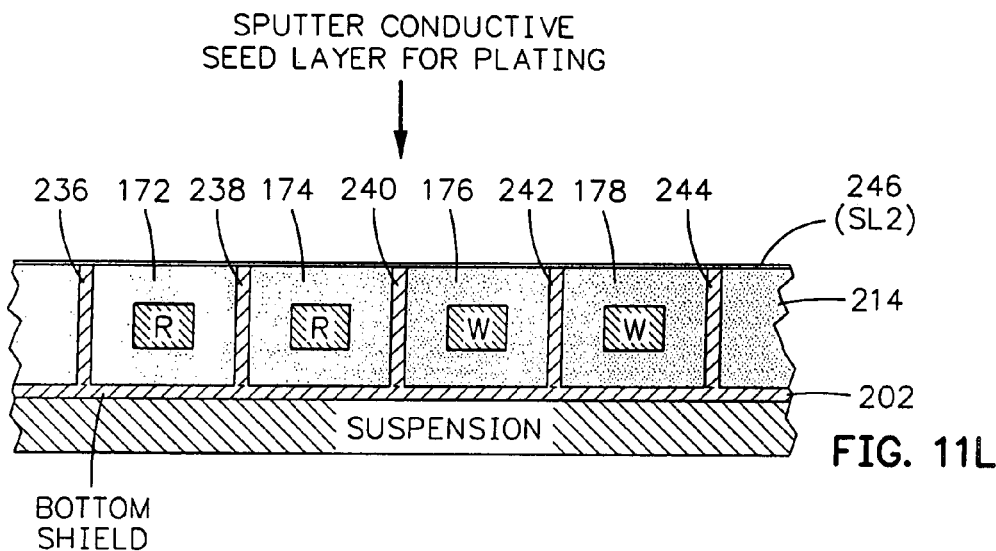
Figure 11M:
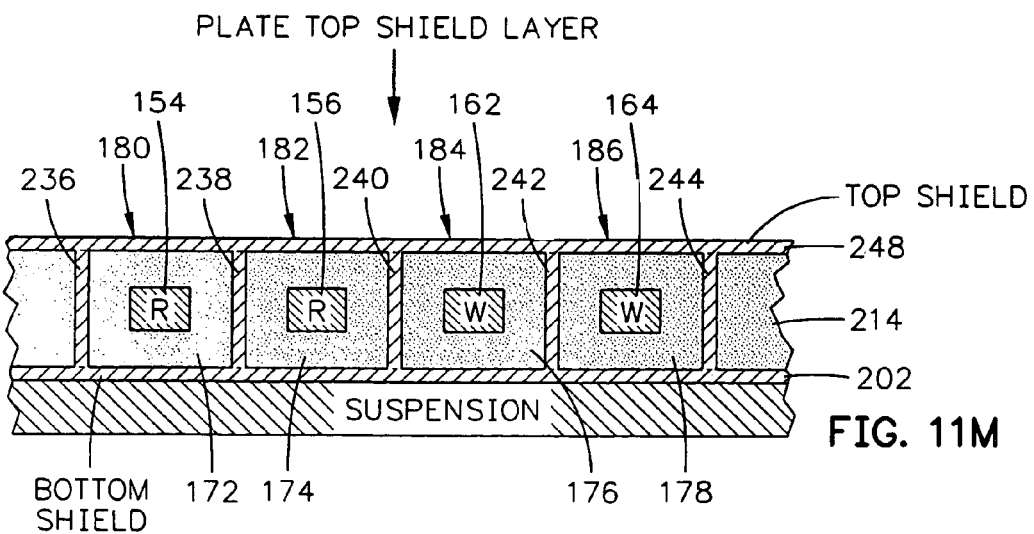

FIG. 11K is the same as FIG. 11J except the second photoresist layer (PR2) has been removed and nonmagnetic electrically conductive middle shield layers 236, 238, 240, 242 and 244 have been plated in the first, second, third, fourth and fifth openings 226, 228, 230, 232 and 234 in electrical contact with the bottom shield layer 202 and planarized so as to have a common top surface with the insulation sheaths 172, 174, 176 and 178. FIG. 11L is the same as FIG. 11K except a nonmagnetic electrically conductive second seed layer (SL2) is sputter deposited on top surfaces of the first, second, third, fourth and fifth middle shield layers 236, 238, 240, 242 and 244 and the first, second, third and fourth insulator sheaths 172, 174, 176 and 178. FIG. 11M is the same as FIG. 11L except a nonmagnetic electrically conductive top shield layer 248 has been plated on the second seed layer so as to make electrical contact with the middle shield layers 236, 238, 240, 242 and 244. At this stage of the method the first and second read wires 154 and 156 are wrapped in the first and second insulator sheaths 172 and 174 and the first and second insulative sheaths 172 and 174 are wrapped in the first and second conductive sheaths 180 and 182 and the first and second write wires 162 and 164 are wrapped in the third and fourth insulator sheaths 176 and 178 and the first and second insulator sheaths 176 and 178 are wrapped in the third and fourth conductive sheaths 184 and 186, as illustrated in FIG. 10.

Figure 11N:
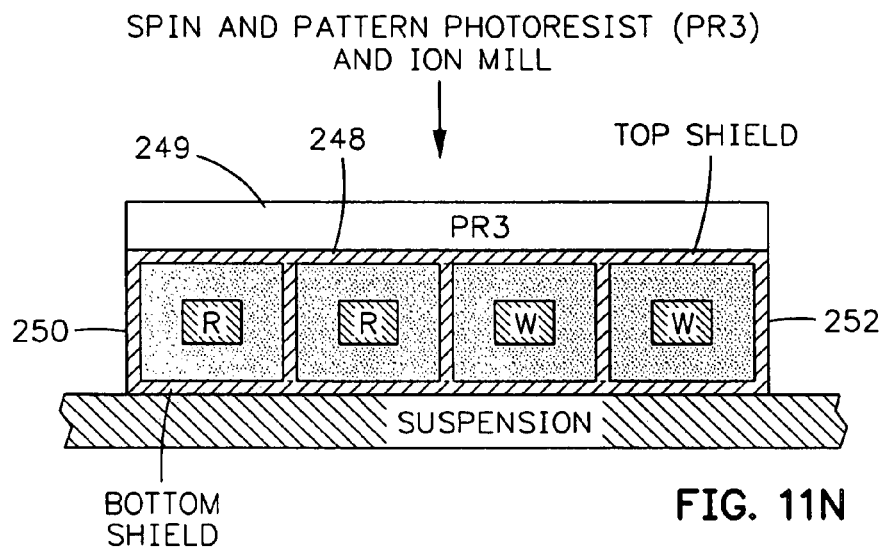
Figure 11:
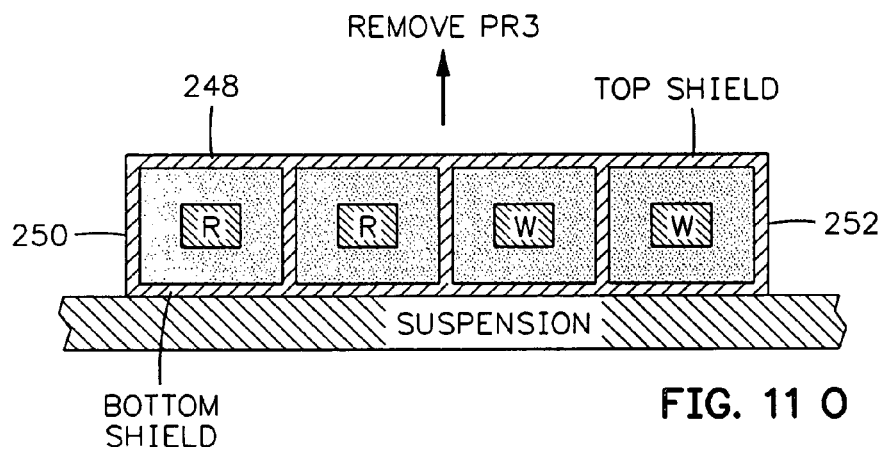
Figure 11:
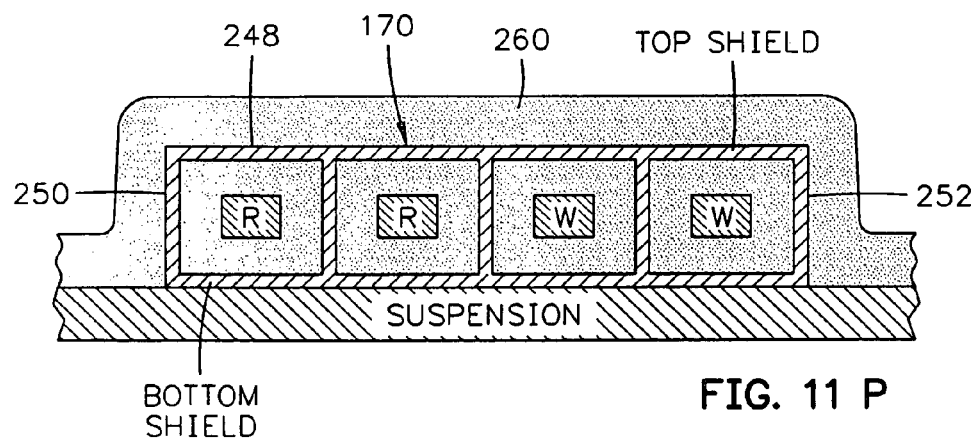

In a preferred method the wires 154, 156, 162 and 164 and the insulative sheaths 172, 174, 176 and 178 and the conductive sheaths 180, 182, 184 and 186 are rectangular or square, as shown in FIG. 10. FIG. 11N is the same as FIG. 11M except a third photoresist layer (PR3) 249 has been spin coated on top of the top shield layer 248 and patterned followed by ion milling to form the first and second sides 250 and 252 of the cable 170 shown in FIG. 10. FIG. 11O is the same as FIG. 11N except the third photoresist layer has been removed leaving the cabling 170, as shown in FIGS. 4 and 10. FIG. 11P is the same as FIG. 11O except a cap layer 260 may be formed on the cable 170, which cap layer 260 may be sputtered alumina.

Figure 12:
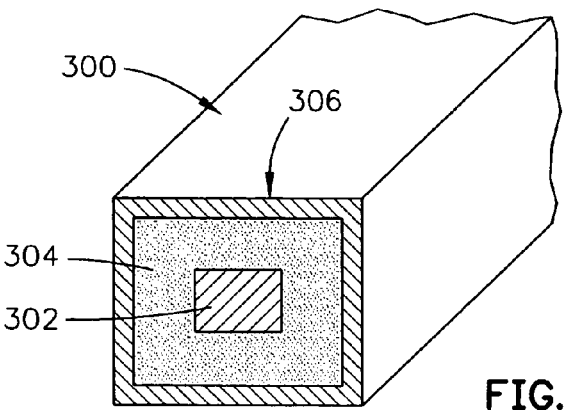
FIG. 12 is another embodiment of a single wire of the present invention shown isometrically and in cross-section.

The first and second read wires 154 and 156 may be fabricated in a cable (not shown) which is separate from a cable (not shown) for the first and second write wires 162 and 164. Still further, each of the wires may be fabricated in a separate cable 300, as shown in FIG. 12. In such a cable a read or write wire 302 is wrapped in a nonmagnetic electrically nonconductive sheath 304 which, in turn, is wrapped in a nonmagnetic electrically conductive sheath 306. While the preferred embodiment of the invention is illustrated in FIGS. 4 and 10, only the first and second read wires 154 and 156 may be provided with the insulator sheaths and the conductive sheaths. As shown in FIG. 4 a front edge 262 of the cable 170 and front ends of the wires 154, 156, 162 and 164 are preferably flush with the front edge 171 of the suspension, a front edge 264 of the slider and pads 152, 153, 158 and 160 so that the wires 154, 156, 162 and 164 are fully protected by the cable 170 after the solder balls 152, 153, 159 and 160 bridge thereacross.

Theory

Figure 13:
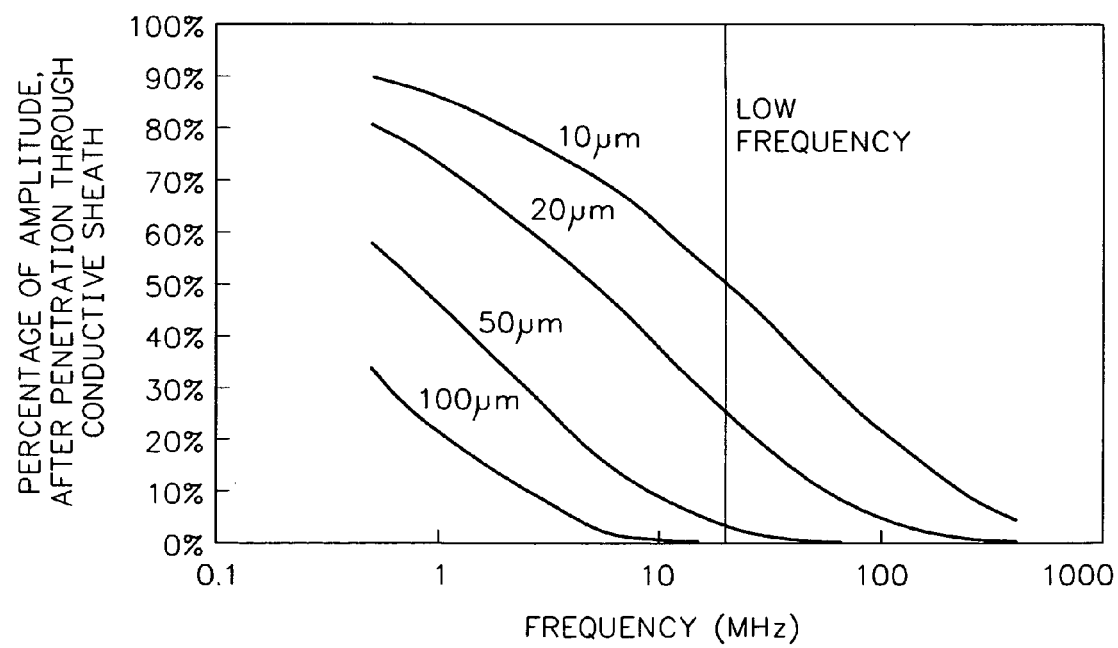
FIG. 13 is a graph showing percentage of amplitude after penetration through a shield versus frequency for various thicknesses of copper sheaths.

With a given frequency of an unwanted RF electromagnetic wave impinging on a copper shield with a thickness t the penetration depth constant $$d = \frac{1}{\sqrt{c\mu\pi f}}$$

where c is conductivity, which is $6.07 \times 10^7$ $$\frac{1}{\Omega - m}$$

for copper, and $\mu$ is permeability, which is $1.26 \times 10^{-6}$ $$\frac{H}{m}$$

for copper. The percentage of the amplitude of the electromagnetic wave after penetrating the thickness t of the conductive sheath is $e^{-j/d}$. A graph, which is shown in FIG. 13 and which is based on the above equations, shows percentage of amplitude of the electromagnetic wave after penetration through the copper shield for thicknesses of the shield equal to 10 μm, 20 μm, 50 μm and 100 μm. It can be seen from the graph that as the thickness of the shield increases the electromagnetic wave is more attenuated. A typical magnetic disk drive has a low frequency of about 20 MHz. It can be seen that with a shield thickness of 100 μm that the amplitude of an electromagnetic wave with a frequency of 20 MHz after penetrating through the conductive sheath is substantially zero.

Discussion

The aforementioned spikes are more damaging to the read sensor when the frequency of the unwanted electromagnetic wave is high. However, when the frequency is high the electromagnetic wave is more quickly attenuated by the shielding, as shown in FIG. 13. The insulative material may be a material other than aluminum oxide ($Al_2O_3$), such as silicon dioxide ($SiO_2$). Instead of employing photoresist for patterning, other forming layers such as silicon dioxide ($SiO_2$) may be deposited, patterned with photoresist and then formed by ion milling. Sputter deposition may be used in lieu of plating in which case the seed layers would be omitted.

The cable 170 may make a 90° bend, as shown in FIG. 4, so as to avoid centrally located structures (not shown) on the suspension 44. The 90° bend, or any other angle or curve, can be easily made with the method described hereinabove. It should also be understood that a support of a tape drive may be employed in lieu of the suspension 44. Still further, the conductive sheaths 180, 182, 184 and 186 in FIG. 10 may form either a square or a rectangle.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawings.

I claim:

1. A method of making first and second read wires and first and second write wires on a substrate comprising the steps of:
   forming an electrically conductive first seed layer on the substrate;
   forming a nonmagnetic electrically conductive bottom shield layer on the seed layer;
   forming an electrically nonconductive bottom insulation layer on the bottom shield layer;
   forming a first forming layer on the bottom insulation layer with first, second, third and fourth openings formed within the first forming layer down to the bottom insulation layer;
   forming electrically conductive wire material into the openings in the first forming layer so as to form said first and second read wires and said first and second write wires;
   removing the first forming layer;
   forming an electrically nonconductive top insulation layer on the bottom insulation layer about and on top of each of the first and second write wires and the first and second read wires;
   forming a second forming layer on a top surface of the top insulation layer with first, second, third, fourth and fifth openings formed within the second forming layer down to the top insulation layer;
   ion milling portions of the top insulation layer exposed by the openings in the second forming layer down to the bottom shield layer;
   removing the second forming layer;
   forming nonmagnetic electrically conductive middle shield layers in first, second, third, fourth and fifth openings formed within the top insulation layer and in electrical contact with the bottom shield layer;
   forming an electrically conductive seed layer on top of the middle shield layers and the top insulation layer; and
   forming a nonmagnetic electrically conductive top shield layer in contact with said top of the middle shield layer.

2. A method as claimed in claim 1 further including:
   forming a cap layer on the top shield layer.

3. A method as claimed in claim 1 wherein each wire of first and second read wires and first and second write wires is formed into a square or a rectangle in cross section, the bottom and top insulation layers are formed into a square or a rectangle about each wire as seen in cross section and the bottom shield layer, the middle shield layers and the top shield layer are formed into a square or a rectangle about each wire with portions of the insulation layers located between each wire and portions of the shield layers in cross section.

4. A method as claimed in claim 3 including:
   sputter depositing a cap layer on the top shield layer.

5. A method as claimed in claim 1 further comprising the step of:
   forming the bottom and top insulation layers to form a square about each respective read and write wire.

6. A method as claimed in claim 5 further comprising the step of:
   forming a pair of middle shield layers and the top and bottom shield layers into a rectangle or a square about the insulation layers and each respective read and write wire.

7. A method as claimed in claim 1 further comprising the step of:
   forming the top and bottom shield layers straight and parallel with respect to one another and forming the middle shield layers straight and parallel with respect to one another and perpendicular with respect to each of the top and bottom shield layers.

8. A method of making first and second read wires and first and second write wires on a suspension comprising the steps of:
   sputter depositing an electrically conductive first seed layer on the suspension;
   plating a nonmagnetic electrically conductive bottom shield layer on the seed layer;
   sputter depositing an electrically nonconductive bottom insulation layer on the bottom shield layer;
   depositing a first forming layer on the bottom insulation layer with first, second, third and fourth openings formed within the first forming layer down to the bottom insulation layer;
   sputter depositing electrically conductive wire material into the openings in the first forming layer so as to form said first and second read wires and said first and second write wires;
   removing the first forming layer;
   sputter depositing an electrically nonconductive top insulation layer on the bottom insulation layer and about and on top of each of the first and second write wires and the first and second read wires;
   depositing a second forming layer on a top surface of the top insulation layer with first, second, third, fourth and fifth openings formed within the second forming layer down to the top insulation layer;
   ion milling portions of the top insulation layer exposed by the openings in the second forming layer down to the bottom shield layer;
   removing the second forming layer;
   plating a nonmagnetic electrically conductive middle shield layer in first, second, third, fourth and fifth openings formed within the top insulation layer and in electrical contact with the bottom shield layer;
   sputter depositing an electrically conductive seed layer on top of the middle shield layers and the top insulation layer;
   plating a nonmagnetic electrically conductive top shield layer in contact with said top of the middle shield layers.

9. A method of making a cable on a substrate comprising the steps of:
   forming an electrically conductive first seed layer on the substrate;
   forming a nonmagnetic electrically conductive bottom shield layer on the seed layer;
   forming an electrically nonconductive bottom insulation layer on the bottom shield layer;
   forming a first forming layer on the bottom insulation layer with a plurality of openings formed within the first forming layer down to the bottom insulation layer;
   forming electrically conductive wire material into each of the openings in the first forming layer so as to form a plurality of wires;
   removing the first forming layer;
   forming an electrically nonconductive top insulation layer on the bottom insulation layer about and on top of each of the wires;
   forming a second forming layer on a top surface of the top insulation layer with a plurality of openings formed within the second forming layer down to the top insulation layer;
   ion milling portions of the top insulation layer exposed by the openings in the second forming layer down to the bottom shield layer;
   removing the second forming layer;
   forming a plurality of electrically conductive middle shield layers in openings formed within the top insulation layer in electrical contact with the bottom shield layer;
   forming an electrically conductive seed layer on tops of the middle shield layers and the top insulation layer; and
   forming a nonmagnetic electrically conductive top shield layer in contact with said tops of the middle shield layer.

10. A method as claimed in claim 9 further including:
    forming a cap layer on the top shield layer.

11. A method as claimed in claim 9 further comprising the step of:
    forming the bottom and top insulation layers to form a square about each respective wire.

12. A method as claimed in claim 11 further comprising the step of:
    forming a pair of middle shield layers and the top and bottom shield layers into a rectangle or a square about the insulation layers and each respective wire.

13. A method as claimed in claim 9 further comprising the step of:
    forming the top and bottom shield layers straight and parallel with respect to one another and forming the middle shield layers straight and parallel with respect to one another and perpendicular with respect to each of the top and bottom shield layers.

* * * * *